US011223005B2

(12) United States Patent
Sandberg et al.

(10) Patent No.: US 11,223,005 B2
(45) Date of Patent: Jan. 11, 2022

(54) GRADIOMETRIC PARALLEL SUPERCONDUCTING QUANTUM INTERFACE DEVICE

(71) Applicant: International Business Machines Corporation, Armonk, NY (US)

(72) Inventors: Martin O. Sandberg, Ossining, NY (US); Vivekananda P. Adiga, Ossining, NY (US); Hanhee Paik, Danbury, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/738,589

(22) Filed: Jan. 9, 2020

(65) Prior Publication Data
US 2020/0152854 A1    May 14, 2020

Related U.S. Application Data

(63) Continuation of application No. 16/125,098, filed on Sep. 7, 2018, now Pat. No. 10,586,911.

(51) Int. Cl.
*H01L 39/08*     (2006.01)
*H01L 39/24*     (2006.01)
(Continued)

(52) U.S. Cl.
CPC ........ *H01L 39/2493* (2013.01); *G01R 33/022* (2013.01); *G01R 33/0354* (2013.01);
(Continued)

(58) Field of Classification Search
CPC ....... H01L 39/025; H01L 39/08; H01L 39/22; H01L 39/223; H01L 39/2493
See application file for complete search history.

(56) References Cited

U.S. PATENT DOCUMENTS 5,574,290 A * 11/1996 You ................... G01R 33/0358
                                                               257/31
6,476,413 B1    11/2002   Jia et al.
(Continued)

FOREIGN PATENT DOCUMENTS

WO     1998/40757 A1    9/1998
WO     2018/052424 A1    3/2018

OTHER PUBLICATIONS

International Search Report and Written Opinion received for PCT Application Serial No. PCT/EP2019/072947 dated Nov. 22, 2019, 18 pages.
(Continued)

*Primary Examiner* — Jae Lee
(74) *Attorney, Agent, or Firm* — Amin, Turocy & Watson, LLP

(57) ABSTRACT

Techniques regarding parallel gradiometric SQUIDs and the manufacturing thereof are provided. For example, one or more embodiments described herein can comprise an apparatus, which can comprise a first pattern of superconducting material located on a substrate. Also, the apparatus can comprise a second pattern of superconducting material that can extend across the first pattern of superconducting material at a position. Further, the apparatus can comprise a Josephson junction located at the position, which can comprise an insulating barrier that can connect the first pattern of superconductor material and the second pattern of superconductor material.

19 Claims, 10 Drawing Sheets

(51) Int. Cl.
  *G01R 33/022* (2006.01)
  *G01R 33/035* (2006.01)
  *H01L 39/06* (2006.01)
(52) U.S. Cl.
  CPC .............. *H01L 39/06* (2013.01); *H01L 39/08* (2013.01); *H01L 39/2451* (2013.01); *H01L 39/2464* (2013.01)

(56) References Cited

U.S. PATENT DOCUMENTS

| | | | |
|---|---|---|---|
| 6,614,047 | B2 | 9/2003 | Tzalenchuk et al. |
| 7,365,534 | B2 | 4/2008 | Tralshawala et al. |
| 8,841,764 | B2 | 9/2014 | Paletto et al. |
| 9,618,591 | B1 | 4/2017 | Radparvar et al. |
| 10,256,392 | B1 * | 4/2019 | Brink .................... B82Y 40/00 |
| 2010/0097056 | A1 | 4/2010 | Lam et al. |
| 2018/0054201 | A1 | 2/2018 | Reagor et al. |
| 2019/0042967 | A1 * | 2/2019 | Yoscovits ......... H01L 29/66977 |
| 2019/0165238 | A1 | 5/2019 | Rosenblatt et al. |

OTHER PUBLICATIONS

Anders et al., "Sub-micrometer-sized, cross-type Nb—AlOx—Nb tunnel junctions with low parasitic capacitance", Superconductor Science and Technology, vol. 22, No. 6, XP020159845, May 14, 2009, 5 pages.

Martinez-Perez, et al.,"Three-Axis Vector Nano Superconducting Quantum Interference Device", ACS Nano ,2016,vol. 10, No. 9, pp. 8308-8315.

Schmelz et al., "Highly sensitive miniature SQUID magnetometer fabricated with cross-type Josephson tunnel junctions", Physica C, North-Holland Publishing, Amsterdam, NL, vol. 476, XP028405759, 2012, pp. 77-80.

Braumuller, et al., "Concentric transmon qubit featuring fast tunability and an anisotropic magnetic dipole moment," Appl. Phys. Lett. 108,032601 {2016); doi: 10.1063/1.4940230,6 pages.

Martinez-Perez, et al., "NanoSQUIDs: Basics & recent advances," denarXiv: 1609.06182v4 [cond-mat.supr-con] May 18, 2018, 26 pages.

Yang, et al., "Superconducting Quantum Interference Device: The Most Sensitive Detector of Magnetic Flux," Tamkang Journal of Science and Engineering, vol. 6, No. 1, pp. 9-18 {2003).

Nagel, et al., "Superconducting quantum interference devices with submicron Nb/HfTi/Nb junctions for investigation of small magnetic particles," arXiv:1106.1985v1 [cond-mat.supr-con]Jun. 10, 2011, 4 pages.

Wu, et al., "The gradiometer flux qubit without an external ftux bias," Supercond. Sci. Technol. 19 {2006), doi:10.1088/0953-2048/19/4/006, 7 pages.

Hutchings, M. D., et al. "Tunable Superconducting Qubits with Flux-Independent Coherence." Syracuse University, Department of Physics; IBM, T J Watson Research Center; Feb. 23, 2017; 17 pages.

Non-Final Office Action received for U.S. Appl. No. 16/125,098 dated Jul. 10, 2019, 23 pages.

* cited by examiner

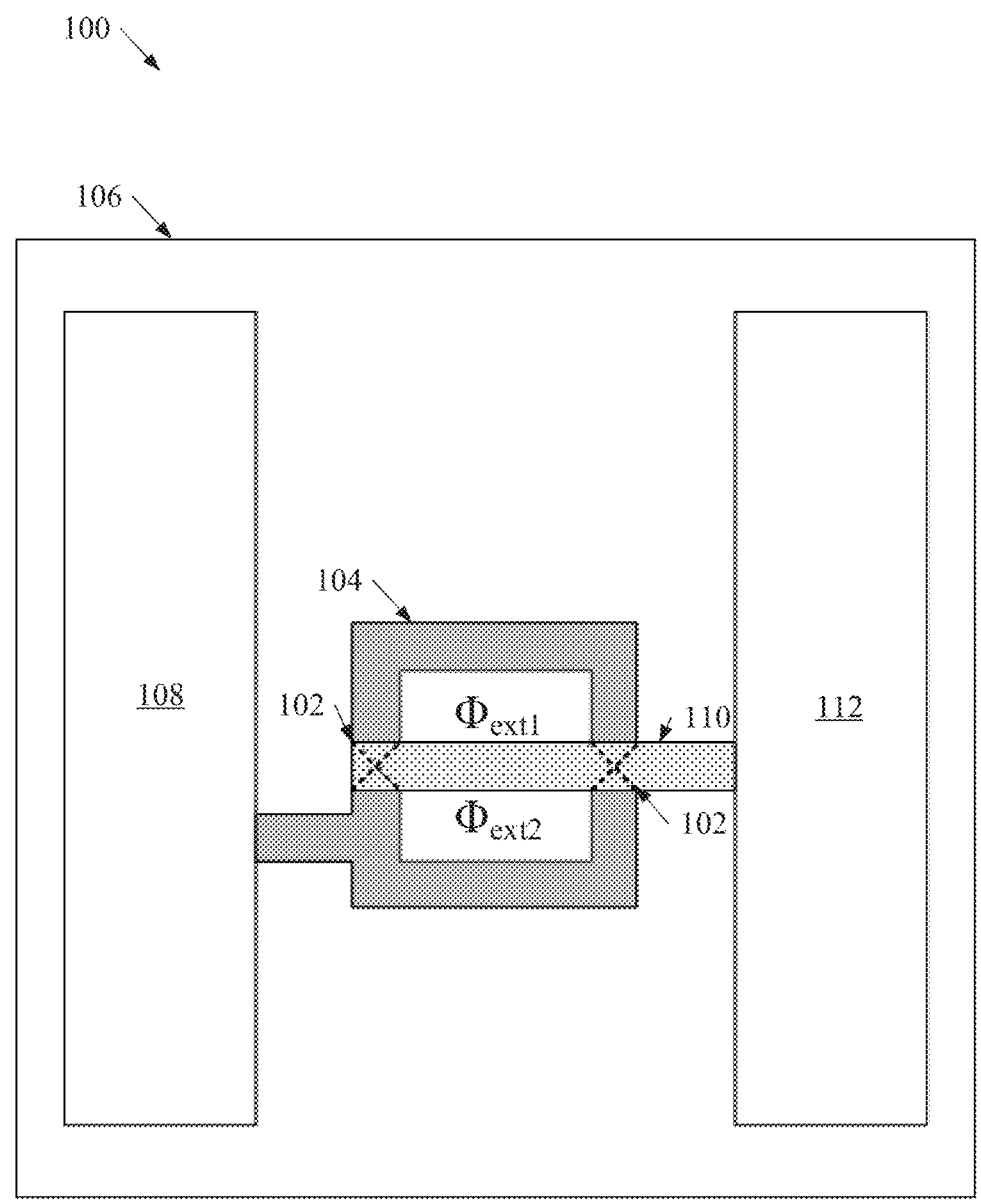
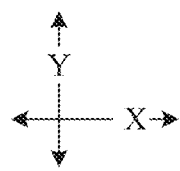
FIG. 1

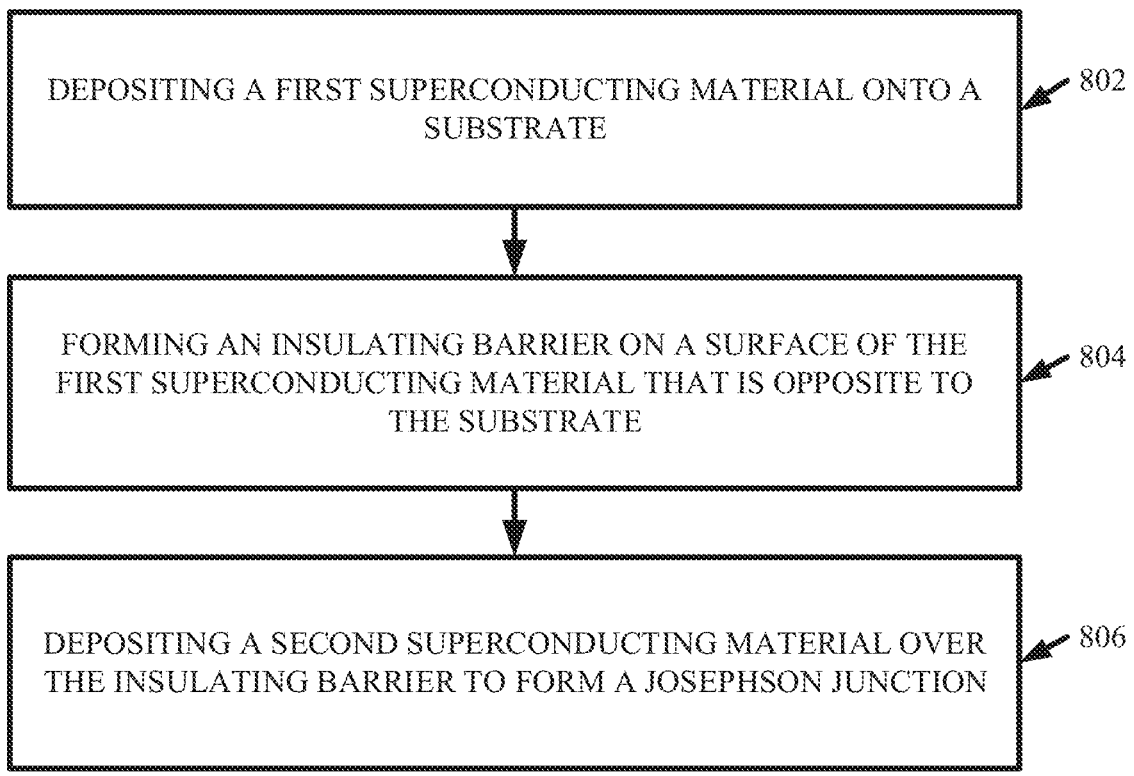

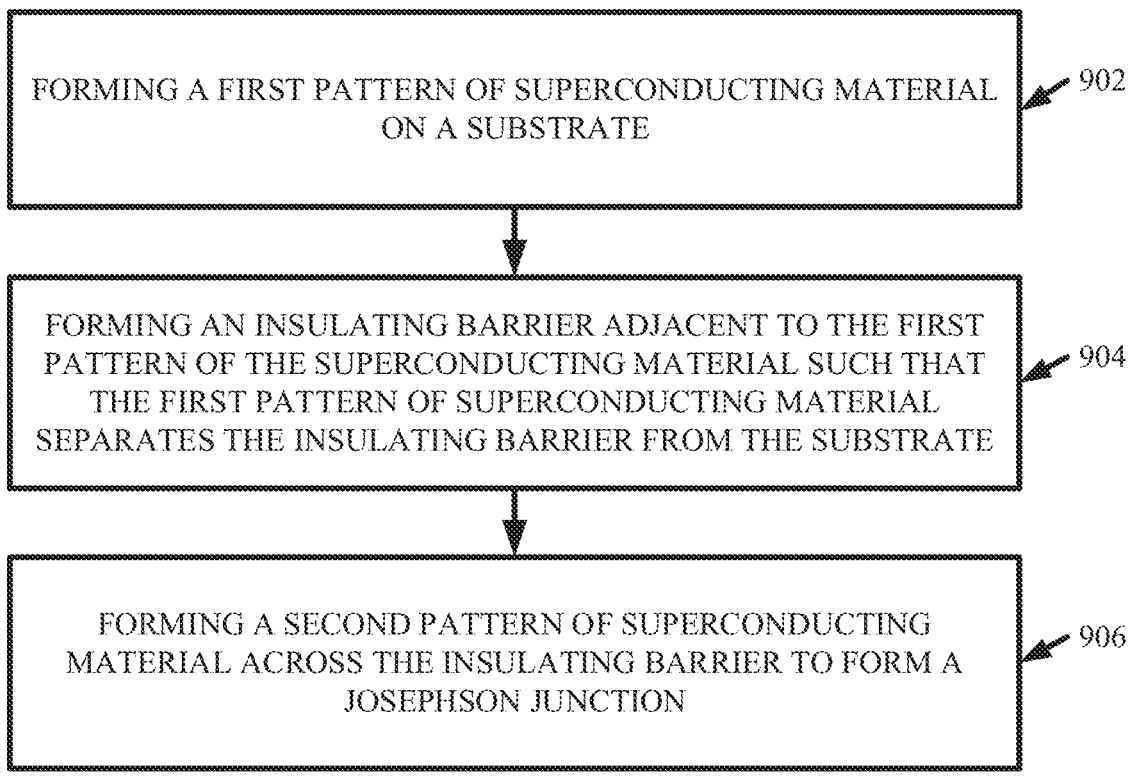

GRADIOMETRIC PARALLEL SUPERCONDUCTING QUANTUM INTERFACE DEVICE

BACKGROUND

The subject disclosure relates to a gradiometric parallel superconducting quantum interface device, and more specifically, to a gradiometric parallel superconducting quantum interface device that can be suitable for frequency tuning of superconducting quantum bits.

Many different types of superconducting devices regard superconducting quantum interference device ("SQUID") technology. The critical current of a SQUID can be tuned by applying a magnetic flux to the loop of the SQUID. The relation between magnetic flux and the critical current is of great importance in several applications such as, in magnetometers and in frequency tuning of superconducting microwave devices (e.g., resonators and quantum bits).

The very high sensitivity to magnetic flux can also be a disadvantage for qubit applications since fluctuations can lead to qubit dephasing. By utilizing a gradiometric design, fluctuations in the absolute global magnetic field can be eliminated and only fluctuations in the magnetic field gradient will lead to dephasing. Conventional gradiometric SQUID design comprises twisting a direct current ("DC") SQUID loop such that the loop crosses over itself and thereby creates two loops and two magnetic fluxes. Typically, to separate the electrodes a dielectric material is deposited at the crossover location in the gradiometric design. However, said positioning of the dielectric material can negatively affect the performance of superconducting quantum bits; thereby limiting the applications of conventional gradiometric SQUIDs.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, apparatuses and/or methods regarding parallel gradiometric SQUIDs are described.

According to an embodiment, an apparatus is provided. The apparatus can comprise a first pattern of superconducting material located on a substrate. Also, the apparatus can comprise a second pattern of superconducting material that can extend across the first pattern of superconducting material at a position. Further, the apparatus can comprise a Josephson junction located at the position, which can comprise an insulating barrier that can connect the first pattern of superconductor material and the second pattern of superconductor material. An advantage of such an apparatus can be a gradiometric SQUID structure that can be sensitive to spatial variations in magnetic fields.

In some examples of the apparatus, the first pattern of superconducting material can be operably coupled to a first capacitor pad, and the second pattern of superconducting material can extend across the first pattern of superconducting material to operably couple to a second capacitor pad. An advantage of such an apparatus can be the implementation of a dipole gradiometric SQUID.

According to an embodiment, an apparatus is provided. The apparatus can comprise a ring of superconductor material. The apparatus can also comprise a path of superconductor material positioned across the ring of superconductor material. Additionally, the apparatus can comprise a Josephson junction, which can comprise an insulating barrier that can connect the ring of superconductor material and the path of superconductor material. An advantage of such an apparatus can be a gradiometric SQUID structure that is suitable for quantum qubits.

In some examples of the apparatus, the Josephson junction can be located at a position where the path of superconducting material crosses over the ring of superconducting material. An advantage of such an apparatus, can be alleviation of the need to separate crossing patterns of superconducting material with a dielectric spacer.

According to an embodiment, an apparatus is provided. The apparatus can comprise a first superconducting pathway located on a substrate. The apparatus can also comprise a second superconducting pathway that can cross over the first superconducting pathway at a position. The apparatus can further comprise a Josephson junction located at the position. The Josephson junction can comprise a first superconductor material of the first superconducting pathway, a second superconductor material of the second superconducting pathway, and an insulating barrier. An advantage of such an apparatus can be a parallel gradiometric SQUID structure that can be more compact than conventional gradiometric SQUID designs.

In some examples, the apparatus can also comprise a third superconducting pathway. The third superconducting pathway can cross over the first superconducting pathway at a second position. Further, the apparatus can comprise a second Josephson junction located at the second position. The second Josephson junction can comprise the first superconductor material, a third superconductor material of the third superconducting pathway, and a second insulating barrier. An advantage of such an apparatus can be one or more parallel gradiometric SQUID implementations having four or more magnetic poles.

According to an embodiment, a method is provided. The method can comprise depositing a first superconducting material onto a substrate. The method can also comprise forming an insulating barrier on a surface of the first superconducting material that is opposite to the substrate. Further, the method can comprise depositing a second superconducting material over the insulating barrier to form a Josephson junction. An advantage of such a method can be that the method can enable the use of electron beam lithography and/or optical lithography in the manufacturing of one or more gradiometric SQUIDs.

In some examples of the method, forming the insulating barrier can comprise oxidizing the first superconductor material. An advantage of such a method can be that the method can enable the use of superconductor-insulator-superconductor Josephson junctions to facilitate a crossover of superconducting material in a gradiometric SQUID that is suitable for quantum qubits.

According to an embodiment, a method is provided. The method can comprise forming a first pattern of superconducting material on a substrate. The method can also comprise forming an insulating barrier adjacent to the first pattern of superconducting material such that the first pattern of superconducting material separates the insulating barrier from the substrate. Further, the method can comprise forming a second pattern of superconducting material across the insulating barrier to form a Josephson junction. An advantage of such a method is that such a method can facilitate creation of a parallel gradiometric SQUID that can allow for frequency tuning using an external magnetic flux.

In some examples of the method, the forming the first superconducting material can comprise evaporating the first superconductor material onto the semiconductor substrate. Also, the forming the second superconducting material can comprise evaporating the second superconducting material over the insulating barrier. An advantage of such a method can be that the method enables use of the Manhattan style fabrication technique to streamline a manufacturing of one or more gradiometric SQUIDs that are suitable for quantum qubits.

BRIEF DESCRIPTION OF THE DRAWINGS

FIG. 1 illustrates a diagram of an example, non-limiting dipole gradiometric superconducting quantum interface device in accordance with one or more embodiments described herein.

FIG. 8 illustrates a flow diagram of an example, non-limiting method that can facilitate manufacturing of one or more gradiometric superconducting quantum interface devices in accordance with one or more embodiments described herein.

FIG. 9 illustrates a flow diagram of an example, non-limiting method that can facilitate manufacturing of one or more gradiometric superconducting quantum interface devices in accordance with one or more embodiments described herein.

DETAILED DESCRIPTION

Figure 2:
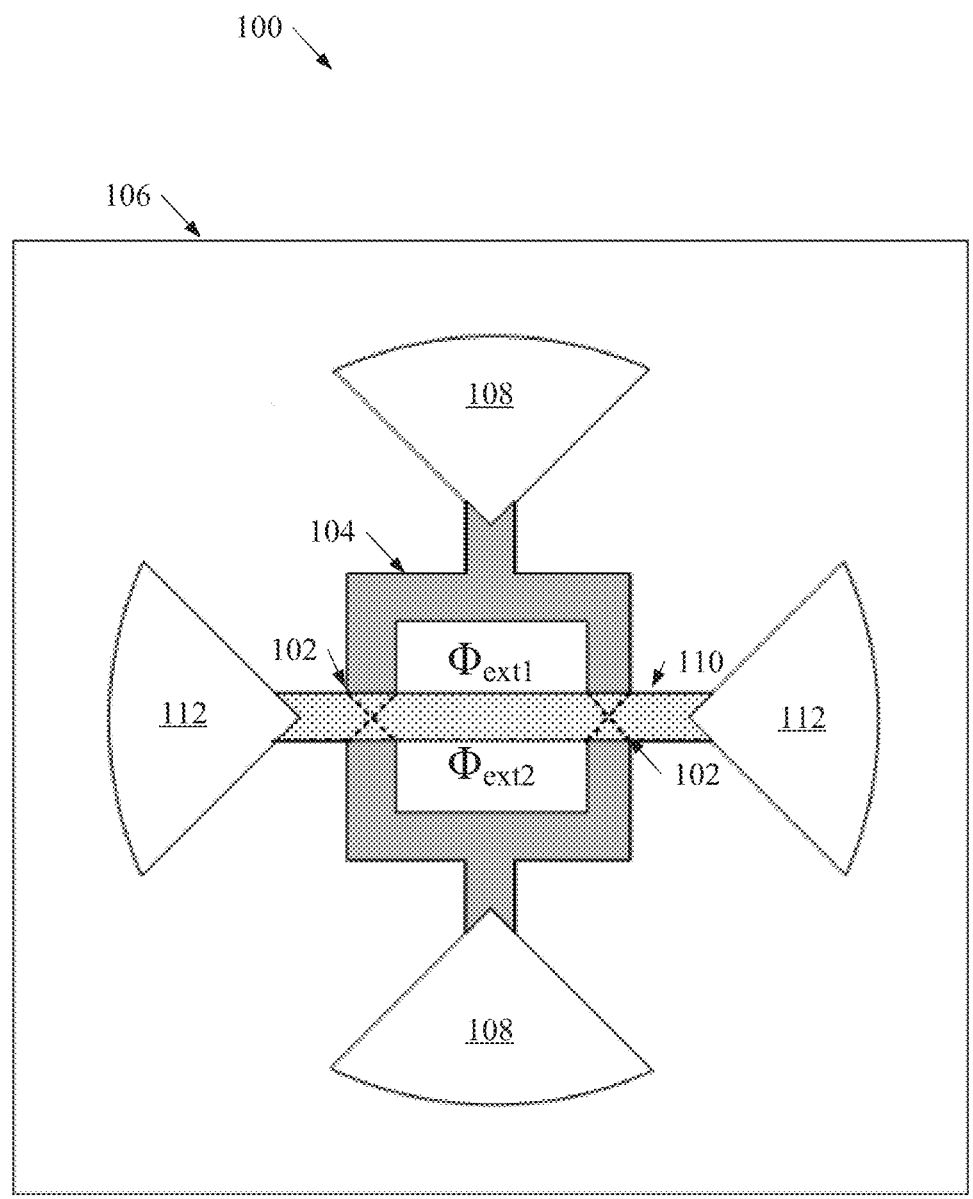
FIG. 2 illustrates a diagram of an example, non-limiting quadrupole pole gradiometric superconducting quantum interface device in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Given the above problems with conventional gradiometric SQUIDs, the present disclosure can be implemented to produce a solution to one or more of these problems in the form of one or more gradiometric parallel SQUIDs without conventional crossover locations that comprise a dielectric spacer. Advantageously, the one or more gradiometric parallel SQUIDs described herein do not require the positioning of dielectric material that is common to conventional gradiometric SQUIDs, do not create isolated segments of superconducting material (e.g., islands of superconducting material), and/or can be suitable for superconducting quantum bits. Further, the one or more gradiometric parallel SQUIDs included in the various embodiments herein can be less sensitive to absolute magnetic flux variations than conventional gradiometric SQUIDs and therefore can be less prone to dephasing due to bias flux noise and/or charge noise than conventional gradiometric implementations. Additionally, the various embodiments of the one or more gradiometric SQUIDs described herein can allow for frequency tuning using one or more external magnetic fluxes.

Various embodiments described herein can regard one or more gradiometric parallel SQUIDs comprising one or more Josephson junctions and that do not require conventional crossover locations nor introduce islands of superconducting material. The one or more gradiometric parallel SQUIDs described herein can be well suited for implementation using double angle evaporation, that can be used for superconducting qubits. Further, in one or more embodiments the gradiometric parallel SQUIDs can be characterized by a compact design that can be implemented using electron beam lithography and/or optical lithography. Additionally, various embodiments described herein can regard one or more methods of manufacturing the one or more gradiometric parallel SQUIDs. For example, in one or more embodiments a thin insulating barrier can be constructed on a top surface of a loop of superconducting material; whereupon a pattern of a second superconducting material can be deposited across the loop, thereby enabling for one or more Josephson junctions between the two superconducting materials. The one or more gradiometric parallel SQUIDs can comprise two or more loops of superconducting material, wherein circulating current through the one or more Josephson junctions can depend on a difference in magnetic field in the two loops. Thus, the various gradiometric parallel SQUIDs described herein can be sensitive to spatial variations in magnetic fields rather than magnetic field magnitudes (e.g., which is common to conventional gradiometric SQUIDs).

FIG. 1 illustrates a diagram of an example, non-limiting top-down view of a gradiometric SQUID 100 that can comprise one or more Josephson junctions 102 in accordance with one or more embodiments described herein. As shown in FIG. 1, the gradiometric SQUID 100 can be a parallel SQUID comprising one or more first superconducting materials 104 located on one or more substrates 106 and operably coupled to one or more first capacitor pads 108. Additionally, the gradiometric SQUID 100 can comprise one or more second superconducting materials 110 located on the one or more substrates 106 and operably coupled to one or more second capacitor pads 112.

The one or more substrates 106 can be, for example, one or more semiconductor substrates. The one or more substrates 106 can support one or more features of the one or more gradiometric SQUIDs 100. Example materials that can comprise the one or more substrates 106 can include, but are not limited to: silicon, germanium, silicon carbide, carbon doped silicon, compound semiconductors (e.g., comprising elements from periodic table groups III, IV, and/or V), silicon oxide, a combination thereof, and/or the like. For instance, the one or more substrates 106 can be a bulk silicon wafer and/or a silicon-on-insulator ("SOI") wafer. Additionally, the one or more substrates 106 can comprise electronic structures such as isolation wires (not shown). Further, the one or more substrates 106 can be characterized by one or more crystalline structures. For example, the one or more substrates 106 can comprise silicon <100>, silicon <110>, and/or silicon <111>, as described using Miller indices. One of ordinary skill in the art will readily recognize that the thickness of the one or more substrates 106 can vary depending on: the composition of the one or more substrates 106, the desired function of the gradiometric SQUID 100, a combination thereof, and/or the like.

The one or more first superconducting materials 104 can be positioned on the one or more substrates 106 in one or more first patterns. For example, the one or more first superconducting materials 104 can be arranged in a ring formation (e.g., as shown in FIG. 1), wherein the ring can have a circular shape, a polygonal shape (e.g., as shown in FIG. 1), and/or an irregular shape. Example materials that can comprise the one or more first superconducting materials 104 can include, but are not limited to: aluminum, niobium, titanium, rhenium, indium, tungsten, titanium niobite, niobium titanium niobate, type-1 superconducting materials, type-2 superconducting materials, alloys thereof, composites thereof, combinations thereof, and/or the like. The one or more first patterns of the one or more first superconducting materials 104 can comprise a uniform distribution of the one or more first superconducting materials 104. Alternatively, the one or more first patterns of the one or more first superconducting materials 104 can comprise a non-uniform distribution of the one or more first superconducting materials 104. For example, the one or more first superconducting materials 104 can comprise a first superconducting metal located at one portion of the first pattern and a second superconducting metal located at another portion of the first pattern. Thus, the first pattern of the one or more first superconducting materials 104 can be electrically continuous with a varying composition of the one or more first superconducting materials 104 at different portions of the first pattern.

One of ordinary skill in the art will recognize that a thickness (e.g., a height of extension from the one or more substrates 106) of the one or more first superconducting materials 104 can vary depending on the composition of the one or more first superconducting materials 104 and/or functionality of the one or more gradiometric SQUIDs 100. For instance, the thickness of the one or more first superconducting materials 104 can be exemplary greater than or equal to 0.5 microns and less than or equal to 1000 microns. Similarly, a width (e.g., along the "Y" axis where the one or more first superconducting materials 104 meet the one or more first capacitor pads 108 in the example implementation presented in FIG. 1) of the one or more first superconducting materials 104 can vary depending on the composition of the one or more first superconducting materials 104 and/or functionality of the one or more gradiometric SQUIDs 100. For instance, the width of the one or more first superconducting materials 104 can be exemplary greater than or equal to 0.5 microns and less than or equal to 1000 microns. The one or more first superconducting materials 104 can be operably (e.g., electrically) coupled to one or more first capacitor pads 108.

Each of the one or more first capacitor pads 108 can correlate to a respective magnetic pole of the gradiometric SQUID 100. The one or more first capacitor pads 108 can be connected to the one or more first superconducting materials 104 and/or can oscillate at a frequency of the subject qubit facilitated by the gradiometric SQUID 100. While FIG. 1 depicts the one or more first capacitor pads 108 having a rectangular shape, the architecture of the one or more first capacitor pads 108 is not so limited. One of ordinary skill in the art will recognize that the one or more first capacitor pads 108 can have a variety of shapes dependent of the functionality of the gradiometric SQUID 100. Example materials that can comprise the one or more first capacitor pads 108 can include, but are not limited to: aluminum, niobium, titanium, rhenium, indium, tungsten, titanium niobite, niobium titanium niobate, a combination thereof, and/or the like.

The one or more second superconducting materials 110 can be positioned on the one or more substrates 106 in one or more second patterns. For example, the one or more second superconducting materials 110 can be arranged in a path formation (e.g., as shown in FIG. 1), wherein the path can extend straight (e.g., as shown in FIG. 1), can comprise bends, and/or can comprise curves. Example materials that can comprise the one or more second superconducting materials 110 can include, but are not limited to: aluminum, niobium, titanium, rhenium, indium, tungsten, titanium niobite, niobium titanium niobite, type-1 superconducting materials, type-2 superconducting materials, alloys thereof, composites thereof, combinations thereof, and/or the like. In one or more embodiments, the one or more second superconducting materials 110 can comprise the same materials and/or can be characterized by the same or substantially same composition as the one or more first superconducting materials 104. Alternatively, in one or more embodiments, the one or more second superconducting materials 110 can comprise different materials and/or can be characterized by a different composition as the one or more first superconducting materials 104.

Further, the one or more second patterns of the one or more second superconducting materials 110 can comprise a uniform distribution of the one or more second superconducting materials 110. Alternatively, the one or more second patterns of the one or more second superconducting materials 110 can comprise a non-uniform distribution of the one or more second superconducting materials 110. For example, the one or more second superconducting materials 110 can comprise a first superconducting metal located at one portion of the second pattern and a second superconducting metal located at another portion of the second pattern. Thus, the second pattern of the one or more second superconducting materials 110 can be electrically continuous with a varying composition of the one or more second superconducting materials 110 at different portions of the second pattern.

One of ordinary skill in the art will recognize that a thickness (e.g., a height of extension from the one or more substrates 106) of the one or more second superconducting materials 110 can vary depending on the composition of the one or more second superconducting materials 110 and/or functionality of the one or more gradiometric SQUIDs 100. For instance, the thickness of the one or more second conducting materials 110 can be exemplary greater than or equal to 0.5 microns and less than or equal to 1000 microns. Similarly, a width (e.g., along the "Y" axis where the one or more second conducting materials 110 meet the one or more second capacitor pads 112 in the example implementation presented in FIG. 1) of the one or more second superconducting materials 110 can vary depending on the composition of the one or more second superconducting materials 110 and/or functionality of the one or more gradiometric SQUIDs 100. For instance, the width of the one or more second conducting materials 110 can be exemplary greater than or equal to 0.5 microns and less than or equal to 1000 microns. The one or more second superconducting materials 110 can be operably (e.g., electrically) coupled to one or more second capacitor pads 112.

Each of the one or more second capacitor pads 108 can correlate to a respective magnetic pole of the gradiometric SQUID 100. Thus, the gradiometric SQUID 100 depicted in FIG. 1 can be a dipole implementation of the various features of the gradiometric SQUID 100 described herein. The one or more second capacitor pads 112 can be connected to the one or more second superconducting materials 110 and/or can oscillate at a frequency of the subject qubit facilitated by the gradiometric SQUID 100. While FIG. 1 depicts the one or more second capacitor pads 112 having a rectangular shape, the architecture of the one or more second capacitor pads 112 is not so limited. One of ordinary skill in the art will recognize that the one or more second capacitor pads 112 can have a variety of shapes dependent of the functionality of the gradiometric SQUID 100. Example materials that can comprise the one or more second capacitor pads 112 can include, but are not limited to: titanium, rhenium, indium, tungsten, titanium niobite, niobium titanium niobate, a combination thereof, and/or the like.

One or more Josephson junctions 102 can be located at one or more positions where the one or more first superconducting materials 104 and the one or more second superconducting materials 110 overlap. In other words, one or more Josephson junctions 102 can be located at one or more positions where the one or more second patterns (e.g., paths of second superconducting material 110) extend over the one or more first patterns (e.g., rings of first superconducting material 104). As shown in FIG. 1, the one or more Josephson junctions 102 can be depicted by a dash lined "X" FIG. 1. In one or more embodiments, the one or more Josephson junctions 102 can be superconductor-insulator-superconductor ("SIS") Josephson junctions 102. For example, the one or more Josephson junctions 102 can comprise a thin insulating barrier between the one or more first superconducting materials 104 and the one or more second superconducting materials 110. The thin insulating barrier can weakly connect the one or more first superconducting materials 104 and the one or more second superconducting materials 110 to facilitate tunneling in accordance with the Josephson effect. Further, the one or more Josephson junctions 102 can be bicrystal grain-boundary junctions or biepitaxial gran-boundary junctions, step-edge junctions, via junctions, crystal junctions, and/or the like.

In one or more embodiments, the one or more Josephson junctions 102 can connect the one or more first patterns (e.g., rings) of the one or more first superconducting materials 104 and the one or more second patterns (e.g., paths) of the one or more second superconducting materials 110 to create a plurality of loops that can facilitate a plurality of magnetic fluxes (e.g., a first magnetic flux depicted by "$\Phi_{ext1}$" in FIG. 1 and/or a second magnetic flux depicted by "$\Phi_{ext2}$"). For example, a first portion of the one or more first superconducting materials 104 can comprise a first layer of a respective Josephson junction 102, a second portion of the one or more second superconducting materials 110 can comprise a second layer of the respective Josephson junction 102, and/or a thin insulating barrier located between the first portion and the second portion can comprise a third layer the respective Josephson junction 102. As shown in FIG. 1, the second pattern (e.g., comprising the one or more second superconducting materials 110) can extend from the one or more second capacitor pad 112 across the first pattern (e.g., comprising the one or more first superconducting materials 104). Additionally, a Josephson junction 102 can be located at one or more positions where the first pattern and second pattern overlap (e.g., where the one or more second superconducting materials 110 cross over the one or more first superconducting materials 104). In one or more embodiments, each pattern of superconducting material (e.g., the first pattern of the one or more first superconducting material 104 and/or the second pattern of the one or more second superconducting material 110) can extend across each other to operably connect to a respective capacitor pad (e.g., a respective first capacitor pad 108 and/or a respective second capacitor pad 112). While a dipole gradiometric SQUID 100 is depicted in FIG. 1, the architecture of the one or more gradiometric SQUIEDS is not so limited.

FIG. 2 illustrates a diagram of an example, non-limiting top-down view of a gradiometric SQUID 100 having a quadrupole pole implementation in accordance with one or more embodiments described herein. Repetitive description of like elements employed in other embodiments described herein is omitted for sake of brevity. As shown in FIG. 2, the one or more gradiometric SQUIDs 100 can comprise a plurality of first capacitor pads 108 and/or a plurality of second capacitor pads 112. For example, the gradiometric SQUID 100 can comprise two first capacitor pads 108 and/or two second capacitor pads 112 for a total of four capacitor pads and/or four respective magnetic poles. For instance, the first pattern (e.g., a ring) of the one or more first superconducting materials 104 can be operably (e.g., electrically) connected to two respective first capacitor pads 108 (e.g., as shown in FIG. 2). Likewise, the second pattern (e.g., a path) of the one or more second superconducting materials 110 can be operably (e.g., electrically) connected to two respective second capacitor pads 112.

While FIGS. 1 and 2 depict one or more gradiometric SQUIDs 100 that can facilitate two magnetic fluxes, the architecture of the one or more gradiometric SQUIDs 100 is not so limited. Likewise, while FIGS. 1 and 2 depict one or more gradiometric SQUIDs 100 that comprise two patterns of superconducting materials (e.g., the first pattern of one or more first superconducting materials 104 and/or the second pattern of one or more second superconducting materials 110), the architecture of the one or more gradiometric SQUIDs 100 is not so limited.

Figure 3:
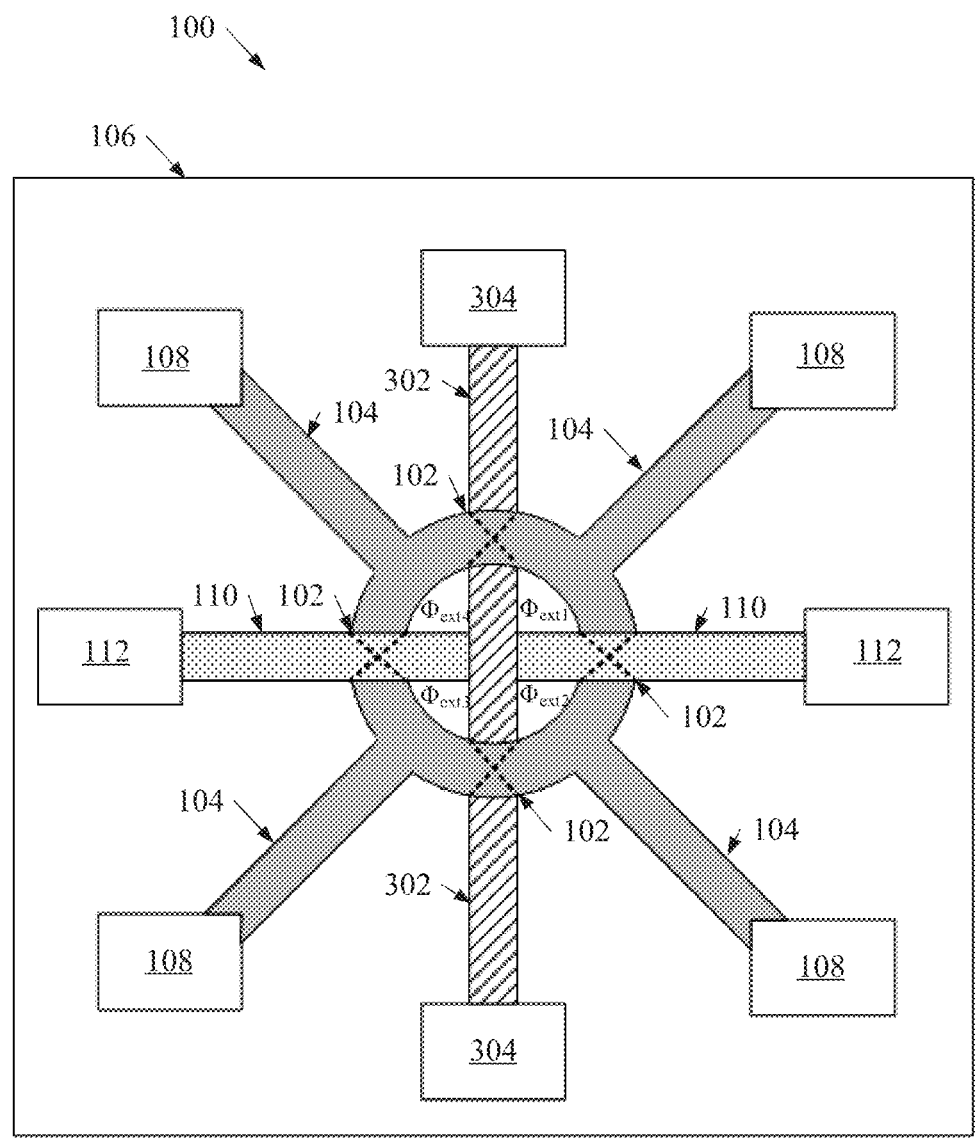
FIG. 3 illustrates a diagram of an example, non-limiting multipole gradiometric superconducting quantum interface device in accordance with one or more embodiments described herein.

FIG. 3 illustrates a diagram of an example, non-limiting top-down view of a gradiometric SQUID 100 having a multipole pole implementation in accordance with one or more embodiments described herein. Repetitive description of like elements employed in other embodiments described herein is omitted for sake of brevity. As shown in FIG. 3, the one or more gradiometric SQUIDs 100 can comprise three or more patterns of superconducting material to facilitate four or more magnetic fluxes.

For example, the one or more first superconducting materials 104 (e.g., patterned in a circular ring shape in the exemplary embodiment of FIG. 3) can be operably connected to a plurality of first capacitor pads 108 (e.g., connected to four first capacitor pads 108 in the exemplary embodiment of FIG. 3), wherein each respective first capacitor pad 108 can correlate to a respective magnetic pole. Additionally, the one or more second superconducting materials 110 (e.g., patterned in a straight path in the exemplary embodiment of FIG. 3) can be operably connected to a plurality of second capacitor pads 112 (e.g., connected to two second capacitor pads 112 in the exemplary embodiment of FIG. 3), wherein each respective second capacitor pad 112 can correlate to a respective magnetic pole. Moreover, the one or more gradiometric SQUIDs 100 can comprise one or more additional superconducting materials, such as one or more third superconducting materials 302.

For instance, the one or more third superconducting materials 302 can be positioned on the one or more substrates 106 in one or more third patterns. For example, the one or more third superconducting materials 302 can be arranged in a path formation (e.g., as shown in FIG. 3), wherein the path can extend straight (e.g., as shown in FIG. 3), can comprise bends, and/or can comprise curves. Example materials that can comprise the one or more third superconducting materials 302 can include, but are not limited to: aluminum, niobium, titanium, rhenium, indium, tungsten, titanium niobite, niobium titanium niobate, alloys thereof, composites thereof, combinations thereof, and/or the like. In one or more embodiments, the one or more third superconducting materials 302 can comprise the same materials and/or can be characterized by the same or substantially same composition as the one or more first superconducting materials 104 and/or the one or more second superconducting materials 110. Alternatively, in one or more embodiments, the one or more third superconducting materials 302 can comprise different materials and/or can be characterized by a different composition as the one or more first superconducting materials 104 and/or the one or more second superconducting materials 110.

Further, the one or more third patterns of the one or more third superconducting materials 302 can comprise a uniform distribution of the one or more third superconducting materials 302. Alternatively, the one or more third patterns of the one or more third superconducting materials 302 can comprise a non-uniform distribution of the one or more third superconducting materials 302. For example, the one or more third superconducting materials 302 can comprise a first superconducting metal located at one portion of the third pattern and a second superconducting metal located at another portion of the third pattern. Thus, the third pattern of the one or more third superconducting materials 302 can be electrically continuous with a varying composition of the one or more third superconducting materials 302 at different portions of the third pattern.

One of ordinary skill in the art will recognize that a thickness (e.g., a height of extension from the one or more substrates 106) of the one or more third superconducting materials 302 can vary depending on the composition of the one or more third superconducting materials 302 and/or functionality of the one or more gradiometric SQUIDs 100. For instance, the thickness of the one or more third superconducting materials 302 can be exemplary greater than or equal to 0.5 microns and less than or equal to 1000 microns. Similarly, a width (e.g., along the "Y" axis where the one or more third superconducting materials 302 meet the one or more third capacitor pads 304 in the example implementation presented in FIG. 3) of the one or more third superconducting materials 302 can vary depending on the composition of the one or more third superconducting materials 302 and/or functionality of the one or more gradiometric SQUIDs 100. For instance, the width of the one or more third superconducting materials 302 can be exemplary greater than or equal to 0.5 microns and less than or equal to 1000 microns. The one or more third superconducting materials 302 can be operably (e.g., electrically) coupled to one or more third capacitor pads 304.

Each of the one or more third capacitor pads 304 can correlate to respective magnetic pole of the gradiometric SQUID 100. Thus, the gradiometric SQUID 100 depicted in FIG. 3 can be a multipole implementation of the various features of the gradiometric SQUID 100 described herein. The one or more third capacitor pads 304 can be connected to the one or more third superconducting materials 302 and/or can oscillate at a frequency of the subject qubit facilitated by the gradiometric SQUID 100. While FIG. 3 depicts the one or more third capacitor pads 304 having a rectangular shape, the architecture of the one or more third capacitor pads 304 is not so limited. One of ordinary skill in the art will recognize that the one or more third capacitor pads 304 can have a variety of shapes dependent of the functionality of the gradiometric SQUID 100. Example materials that can comprise the one or more third capacitor pads 304 can include, but are not limited to: aluminum, niobium, titanium, rhenium, indium, tungsten, titanium niobite, niobium titanium niobate, a combination thereof, and/or the like.

As shown in FIG. 3, one or more Josephson junctions 102 can be located where one pattern of superconducting material overlaps and/or otherwise cross over another pattern of superconducting material. For example, one or more Josephson junctions 102 can be located where the first pattern of the one or more first superconducting materials 104 cross the third pattern of the one or more third superconducting materials 302. For instance, one or more Josephson junctions 102 can connect the first pattern of one or more first superconducting materials 104 and the third pattern of one or more third superconducting materials 302 just as one or more Josephson junctions 102 can connect the first pattern of one or more first superconducting materials 104 and the second pattern of one or more second superconducting materials 110, as described herein. Thus, the third pattern of one or more third superconducting materials 302, along with one or more Josephson junctions 102 connected to the third pattern, can create one or more loops of superconducting material within the gradiometric SQUID 100, which can facilitate the occurrence of additional magnetic fluxes (e.g., the occurrence of four magnetic fluxes in the exemplary embodiment of FIG. 3, wherein the magnetic fluxes are respectively depicted by "$\Phi_{ext1}$", "$\Phi_{ext2}$", "$\Phi_{ext3}$", "$\Phi_{ext4}$").

As shown in FIG. 3, the respective patterns of superconducting material can overlap each other, cross each other, and/or weave between each other. Additionally, the respective patterns of superconducting material can extend from and/or extend between respective capacitor pads.

Figure 4A:
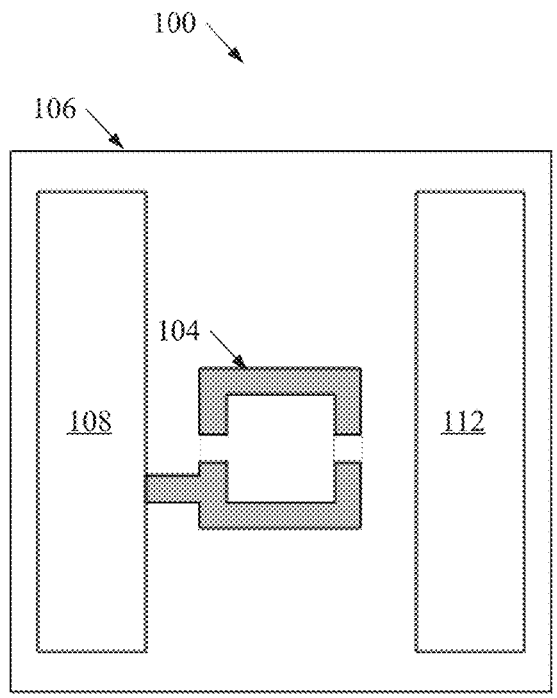
FIG. 4A illustrates a diagram of an example, non-limiting dipole implementation of a gradiometric superconducting quantum interface device during a first stage of manufacturing in accordance with one or more embodiments described herein.

FIG. 4A illustrates a diagram of an example, non-limiting gradiometric SQUID 100 during a first stage of manufacturing in accordance with one or more embodiments described herein. Repetitive description of like elements employed in other embodiments described herein is omitted for sake of brevity. For example, FIG. 4A can depict the first stage of manufacturing of the exemplary embodiment of FIG. 1.

During a first stage of manufacturing, a first portion of the one or more first superconducting materials 104 can be deposited onto the one or more substrates 106. Depositing the first portion of the one or more first superconducting materials 104 during the first stage of manufacturing can partially form the first pattern (e.g., can partially form a ring pattern). Additionally, depositing the first portion of the one or more first superconducting materials 104 during the first stage of manufacturing can operably couple the one or more first superconducting materials 104 to the one or more first capacitor pads 108. As shown in FIG. 4A, during the first stage of manufacturing the first portion of the one or more first superconducting materials 104 can be deposited onto the one or more substrates 106 at the desired location of the first pattern except at the desired locations of the one or more Josephson junctions 102. For example, a gap in the first pattern of one or more first superconducting materials 104 can be created where the one or more Josephson junctions 102 can be located.

Deposition of the first portion of the one or more first superconducting materials 104 during the first stage of manufacturing can be facilitate by one or more deposition techniques, which can include, but are not limited to: thermal evaporation, electron beam evaporation, electron beam sputtering, ion-sputtering, plasma sputtering, pulsed-laser sputtering, molecular-beam epitaxy ("MBE") growth, epitaxial growth, a combination thereof, and/or the like. One of ordinary skill in the art will recognize that the type of deposition technique utilized can vary depending on the composition of the first portion of the one or more first superconducting materials 104 and/or the design of the first pattern. Additionally, the deposition can be facilitated by one or more lithography process, which can include, but are not limited to: electron beam lithography, optical lithography, deep-ultraviolet lithography, direct laser lithography, a combination thereof, and/or the like.

Figure 4B:
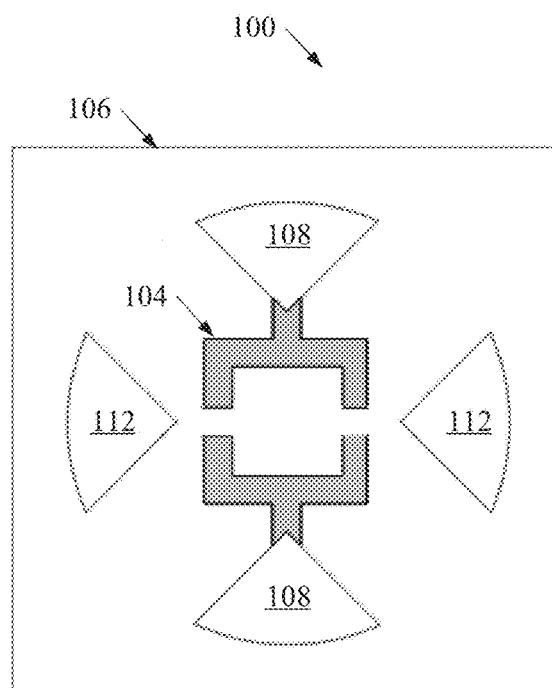
FIG. 4B illustrates a diagram of an example, non-limiting quadrupole pole implementation of a gradiometric superconducting quantum interface device during a first stage of manufacturing in accordance with one or more embodiments described herein.

FIG. 4B illustrates another diagram of an example, non-limiting gradiometric SQUID 100 during a first stage of manufacturing in accordance with one or more embodiments described herein. Repetitive description of like elements employed in other embodiments described herein is omitted for sake of brevity. For example, FIG. 4B can depict the first stage of manufacturing of the exemplary embodiment of FIG. 2. The features of the first stage of manufacturing described herein with regards to FIG. 4A can also be implemented in the first stage of manufacturing in any of the various embodiments of the one or more gradiometric SQUIDs 100, such as the first stage of manufacturing depicted in FIG. 4B.

Figure 4C:
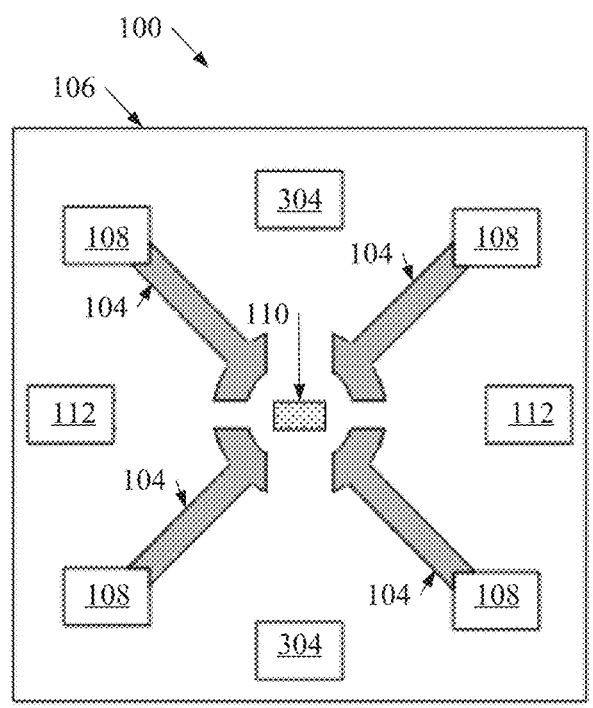
FIG. 4C illustrates a diagram of an example, non-limiting multipole implementation of a gradiometric superconducting quantum interface device during a first stage of manufacturing in accordance with one or more embodiments described herein.

FIG. 4C illustrates a further diagram of an example, non-limiting gradiometric SQUID 100 during a first stage of manufacturing in accordance with one or more embodiments described herein. Repetitive description of like elements employed in other embodiments described herein is omitted for sake of brevity. For example, FIG. 4C can depict the first stage of manufacturing of the exemplary embodiment of FIG. 3. The features of the first stage of manufacturing described herein with regards to FIG. 4A can also be implemented in the first stage of manufacturing in any of the various embodiments of the one or more gradiometric SQUIDs 100, such as the first stage of manufacturing depicted in FIG. 4C.

Additionally, as disclosed in FIG. 4C, a first portion of the one or more second superconducting materials 110 can be deposited during the first stage of manufacturing to partially define the second pattern. For example, the first portion of the one or more first superconducting materials 104 can have the same composition as the first portion of the one or more second superconducting materials 110; thereby facilitating a common deposition during the fourth stage of manufacturing. Therefore, at least a portion of the second pattern (e.g., comprising the one or more second superconducting materials 110) can be deposited along with the first portion of the one or more first superconducting materials 104.

Figure 5A:
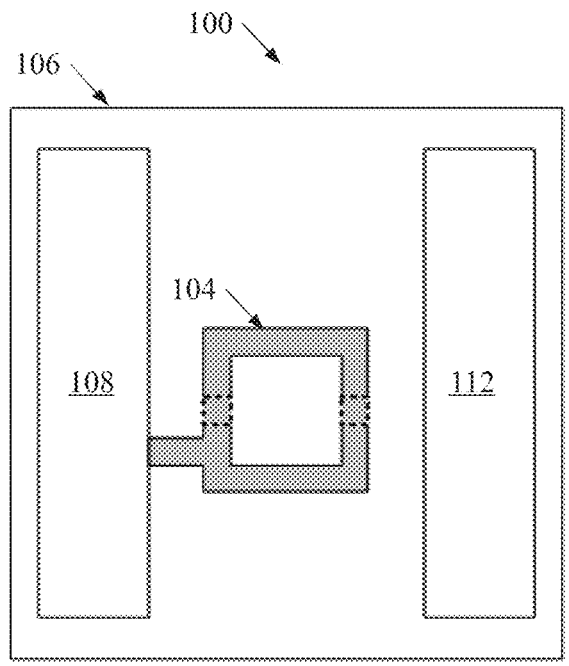
FIG. 5A illustrates a diagram of an example, non-limiting dipole implementation of a gradiometric superconducting quantum interface device during a second stage of manufacturing in accordance with one or more embodiments described herein.

FIG. 5A illustrates a diagram of an example, non-limiting gradiometric SQUID 100 during a second stage of manufacturing in accordance with one or more embodiments described herein. Repetitive description of like elements employed in other embodiments described herein is omitted for sake of brevity. For example, FIG. 5A can depict the second stage of manufacturing of the exemplary embodiment of FIG. 1.

During a second stage of manufacturing, a second portion of the one or more first superconducting materials 104 can be deposited onto the one or more substrates 106. Depositing the second portion of the one or more first superconducting materials 104 during the second stage of manufacturing can complete the first pattern (e.g., a ring pattern). As shown in FIG. 5A, the location of the deposition of the second portion of the one or more first superconducting materials 104 can be indicated by a dash lined box. The second portion of the one or more first superconducting materials 104 can be deposited at respective locations where there can be respective Josephson junctions 102 connecting the one or more first superconducting materials 104 to one or more other patterns of superconducting materials (e.g., the second pattern of the one or more second superconducting materials 110). Additionally, the composition of the second portion of the one or more first superconducting materials 104 can be the same or different than the composition of the first portion of the one or more first superconducting materials 104. In one or more embodiments, the second portion of the first superconducting materials 104 can be a superconducting metal that can be subject to oxidation, such as aluminum.

Deposition of the second portion of the one or more first superconducting materials 104 during the second stage of manufacturing can be facilitate by one or more deposition techniques, which can include, but are not limited to: thermal evaporation, electron beam evaporation, electron beam sputtering, ion-sputtering, plasma sputtering, pulsed-laser sputtering, MBE growth, epitaxial growth, a combination thereof, and/or the like. One of ordinary skill in the art will recognize that the type of deposition technique utilized can vary depending on the composition of the second portion of the one or more first superconducting materials 104 and/or the design of the first pattern. Additionally, the deposition can be facilitated by one or more lithography process, which can include, but are not limited to: electron beam lithography, optical lithography, deep-ultraviolet lithography, direct laser lithography, a combination thereof, and/or the like.

Figure 5B:
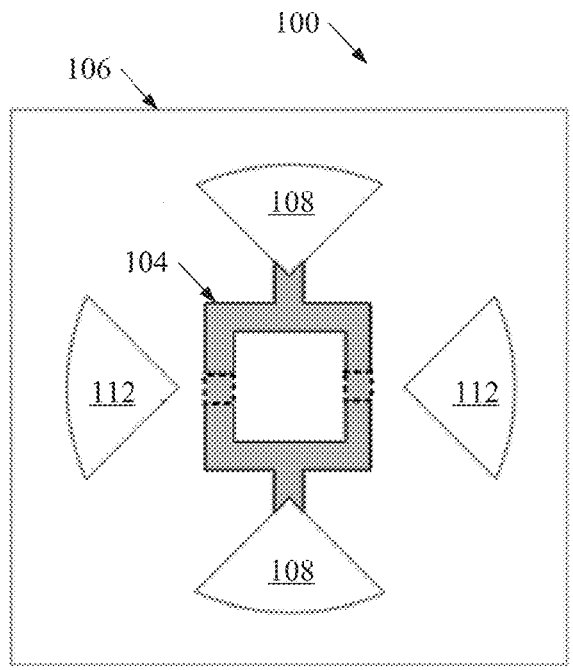
FIG. 5B illustrates a diagram of an example, non-limiting quadrupole pole implementation of a gradiometric superconducting quantum interface device during a second stage of manufacturing in accordance with one or more embodiments described herein.

FIG. 5B illustrates another diagram of an example, non-limiting gradiometric SQUID 100 during a second stage of manufacturing in accordance with one or more embodiments described herein. Repetitive description of like elements employed in other embodiments described herein is omitted for sake of brevity. For example, FIG. 5B can depict the second stage of manufacturing of the exemplary embodiment of FIG. 2. The features of the second stage of manufacturing described herein with regards to FIG. 5A can also be implemented in the second stage of manufacturing in any of the various embodiments of the one or more gradiometric SQUIDs 100, such as the second stage of manufacturing depicted in FIG. 5B.

Figure 5C:
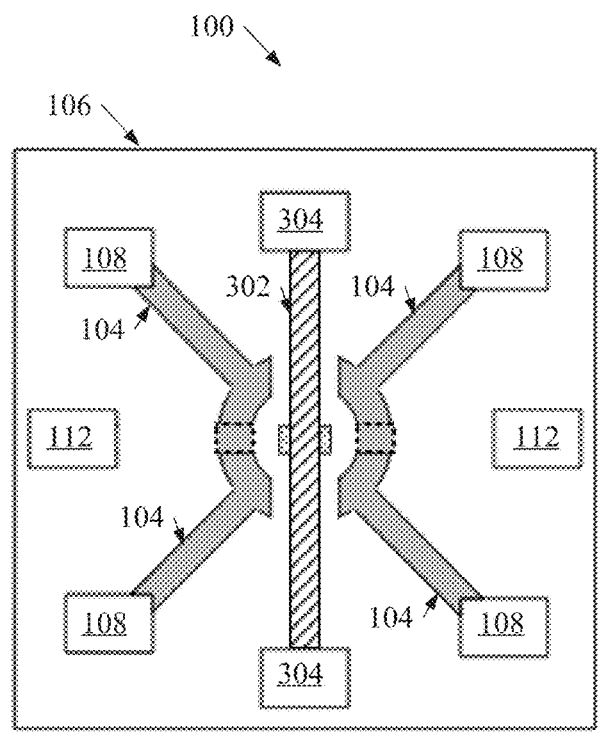
FIG. 5C illustrates a diagram of an example, non-limiting multipole implementation of a gradiometric superconducting quantum interface device during a second stage of manufacturing in accordance with one or more embodiments described herein.

FIG. 5C illustrates a further diagram of an example, non-limiting gradiometric SQUID 100 during a second stage of manufacturing in accordance with one or more embodiments described herein. Repetitive description of like elements employed in other embodiments described herein is omitted for sake of brevity. For example, FIG. 5C can depict the second stage of manufacturing of the exemplary embodiment of FIG. 3. The features of the second stage of manufacturing described herein with regards to FIG. 5A can also be implemented in the second stage of manufacturing in any of the various embodiments of the one or more gradiometric SQUIDs 100, such as the second stage of manufacturing depicted in FIG. 5C.

Additionally, FIG. 5C illustrates that during the second stage of manufacturing, one or more portions of other patterns of superconducting material can also be deposited. Also, as depicted in FIG. 5C, a second portion of the one or more first superconducting materials 104 (e.g., defined by dashed lines in FIG. 5C) can be deposited during the second stage of manufacturing to further define the first pattern. The pattern portions deposited during the second stage of manufacturing can comprise the same materials. For example, as shown in FIG. 5C, the one or more third superconducting materials 302 can be deposited during the second stage of manufacturing along with the second portion of the one or more first superconducting materials 104, wherein the second portion of the one or more first superconducting materials 104 and the one or more third superconducting materials 302 can have the same composition. For instance, the one or more third superconducting materials 302 and/or the one or more first superconducting materials 104 comprising the second portion of the first pattern can be a superconducting metal that can be subject to oxidation, such as aluminum.

Figure 6A:
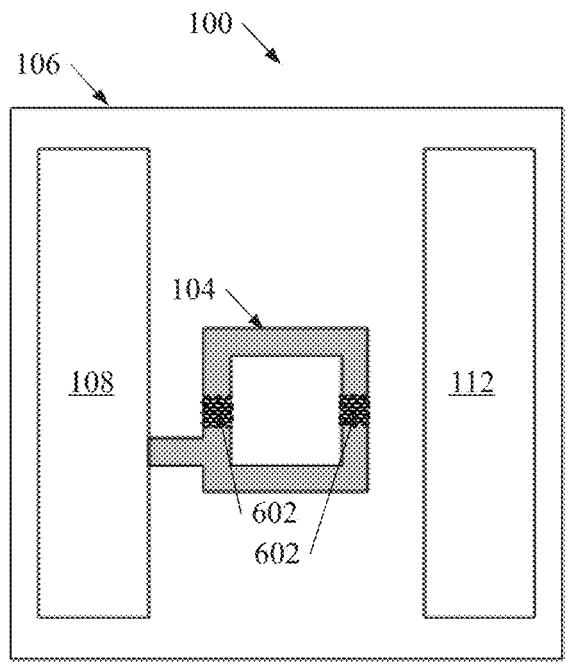
FIG. 6A illustrates a diagram of an example, non-limiting dipole implementation of a gradiometric superconducting quantum interface device during a third stage of manufacturing in accordance with one or more embodiments described herein.

FIG. 6A illustrates a diagram of an example, non-limiting gradiometric SQUID 100 during a third stage of manufacturing in accordance with one or more embodiments described herein. Repetitive description of like elements employed in other embodiments described herein is omitted for sake of brevity. For example, FIG. 6A can depict the second stage of manufacturing of the exemplary embodiment of FIG. 1.

During a third stage of manufacturing, one or more insulating materials 602 can be formed. The one or more insulating materials 602 can serve as one or more thin insulating barriers comprised with the one or more Josephson junctions 102. For example, the one or more insulating materials 602 can be formed at the future locations of Josephson junctions 102.

In one or more embodiments, the one or more insulating materials 602 can be formed by oxidizing the superconducting materials deposited during the second stage of manufacturing. For example, as shown in FIG. 6A, the second portion of the one or more first superconducting materials 104 can be oxidized to form the one or more insulating materials 602. For instance, the second portion of the first superconducting materials 104 can be aluminum, which can be oxidized during the third stage of manufacturing to form one or more insulating materials 602 of aluminum oxide.

In various embodiments, the one or more insulating materials 602 can be formed on a top surface (e.g., a surface facing away from the one or more substrates 106) of a superconducting material, such as one or more sections of the first pattern of the one or more first superconducting materials 104. One of ordinary skill in the art will recognize that a thickness (e.g., a height of extension from the top surface of a superconducting material) of the one or more insulating materials 602 can vary depending on the composition of the one or more insulating materials 602 and/or functionality of the one or more gradiometric SQUIDs 100. For instance, the thickness of the one or more insulating materials 602 can be exemplary greater than or equal to 0.5 microns and less than or equal to 1000 microns.

Figure 6B:
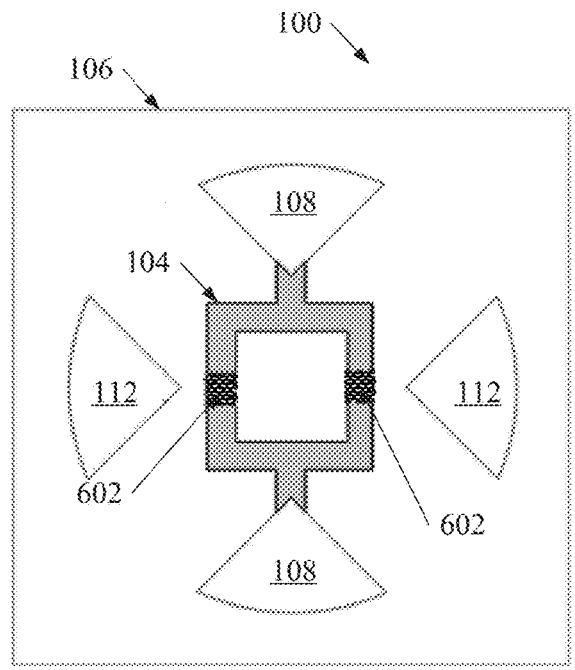
FIG. 6B illustrates a diagram of an example, non-limiting quadrupole pole implementation of a gradiometric superconducting quantum interface device during a third stage of manufacturing in accordance with one or more embodiments described herein.

FIG. 6B illustrates another diagram of an example, non-limiting gradiometric SQUID 100 during a third stage of manufacturing in accordance with one or more embodiments described herein. Repetitive description of like elements employed in other embodiments described herein is omitted for sake of brevity. For example, FIG. 6B can depict the third stage of manufacturing of the exemplary embodiment of FIG. 2. The features of the third stage of manufacturing described herein with regards to FIG. 6A can also be implemented in the third stage of manufacturing in any of the various embodiments of the one or more gradiometric SQUIDs 100, such as the third stage of manufacturing depicted in FIG. 6B.

Figure 6C:
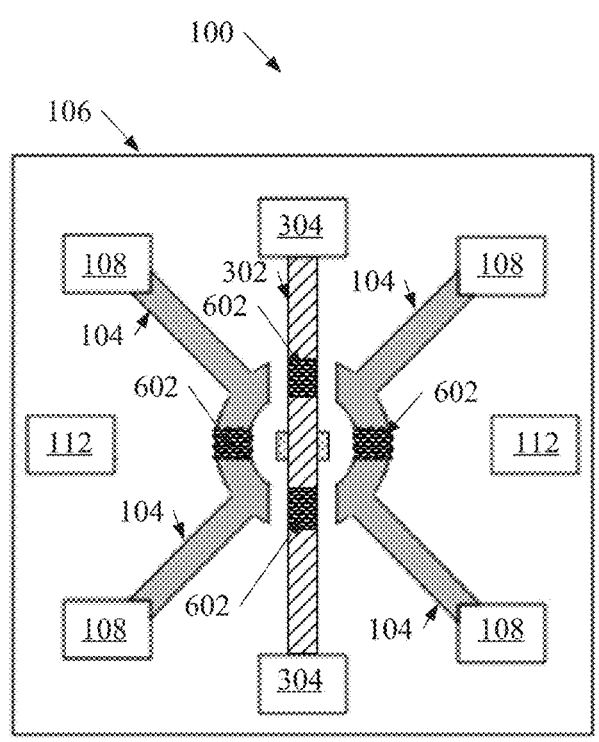
FIG. 6C illustrates a diagram of an example, non-limiting multipole implementation of a gradiometric superconducting quantum interface device during a third stage of manufacturing in accordance with one or more embodiments described herein.

FIG. 6C illustrates a further diagram of an example, non-limiting gradiometric SQUID 100 during a third stage of manufacturing in accordance with one or more embodiments described herein. Repetitive description of like elements employed in other embodiments described herein is omitted for sake of brevity. For example, FIG. 6C can depict the third stage of manufacturing of the exemplary embodiment of FIG. 3. The features of the third stage of manufacturing described herein with regards to FIG. 6A can also be implemented in the third stage of manufacturing in any of the various embodiments of the one or more gradiometric SQUIDs 100, such as the third stage of manufacturing depicted in FIG. 6C.

Additionally, FIG. 6C illustrates that during the third stage of manufacturing, a portion of superconducting material can be isolated for formation of the one or more insulating materials 602. For example, the third pattern of the one or more third superconducting materials 302 can have a uniform or substantially uniform composition, wherein some sections of the one or more third superconducting materials 302 can facilitate formation of the one or more insulating materials 602 (e.g., be oxidized) while other sections can remain unmodified during the third stage of manufacturing. For instance, one or more masking layers can be used during the third stage of manufacturing to direct the formation of the one or more insulating materials 602. Alternatively, in various embodiments the one or more insulating materials 602 can be formed on any suitable superconducting materials without directing formation to particular locations (e.g., the entire third pattern can be subject to oxidation and thereby form an oxidized top layer to serve as the one or more insulating materials 602).

Figure 7A:
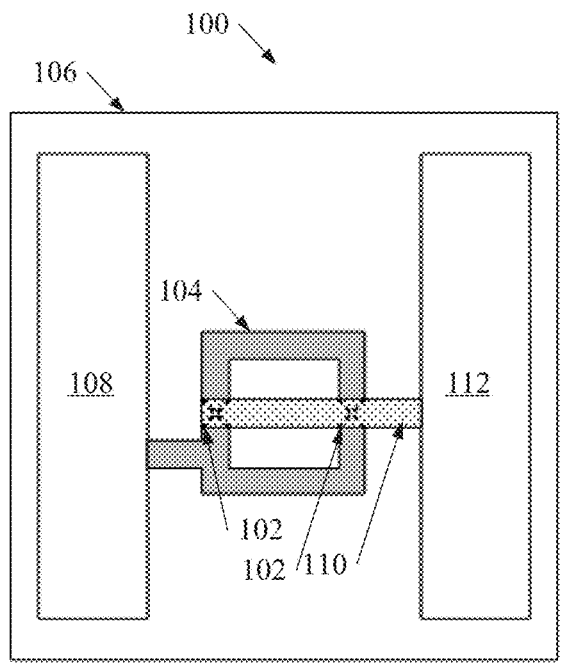
FIG. 7A illustrates a diagram of an example, non-limiting dipole implementation of a gradiometric superconducting quantum interface device during a fourth stage of manufacturing in accordance with one or more embodiments described herein.

FIG. 7A illustrates a diagram of an example, non-limiting gradiometric SQUID 100 during a fourth stage of manufacturing in accordance with one or more embodiments described herein. Repetitive description of like elements employed in other embodiments described herein is omitted for sake of brevity. For example, FIG. 7A can depict the fourth stage of manufacturing of the exemplary embodiment of FIG. 1.

A fourth stage of manufacturing can comprise depositing additional superconducting material to: form one or more additional patterns of superconducting material, complete one or more partially existing patterns of superconducting material, and/or form one or more Josephson junctions 102. For example, as shown in FIG. 7A, during the fourth stage of manufacturing, the one or more second superconducting materials 110 can be deposited onto the one or more insulating materials 602 and/or the one or more substrates 106 such that the second pattern of one or more second superconducting materials 110 can be formed. As shown in FIG. 7A, the deposition of superconducting material during the fourth stage of manufacturing can form the second pattern, which can extend form the one or more second capacitor pads 112 across the first pattern (e.g., comprising the one or more first superconducting materials 104) and the one or more insulating materials 602; thereby forming one or more Josephson junctions 102 and/or two loops of superconducting material.

Deposition of the additional superconducting material (e.g., the one or more second superconducting materials 110) during the fourth stage of manufacturing can be facilitate by one or more deposition techniques, which can include, but are not limited to: thermal evaporation, electron beam evaporation, electron beam sputtering, ion-sputtering, plasma sputtering, pulsed-laser sputtering, MBE growth, epitaxial growth, a combination thereof, and/or the like. One of ordinary skill in the art will recognize that the type of deposition technique utilized can vary depending on the composition of the additional superconducting materials (e.g., the one or more second superconducting materials 110) and/or the design of the first pattern. Additionally, the deposition can be facilitated by one or more lithography process, which can include, but are not limited to: electron beam lithography, optical lithography, deep-ultraviolet lithography, direct laser lithography, a combination thereof, and/or the like.

Figure 7B:
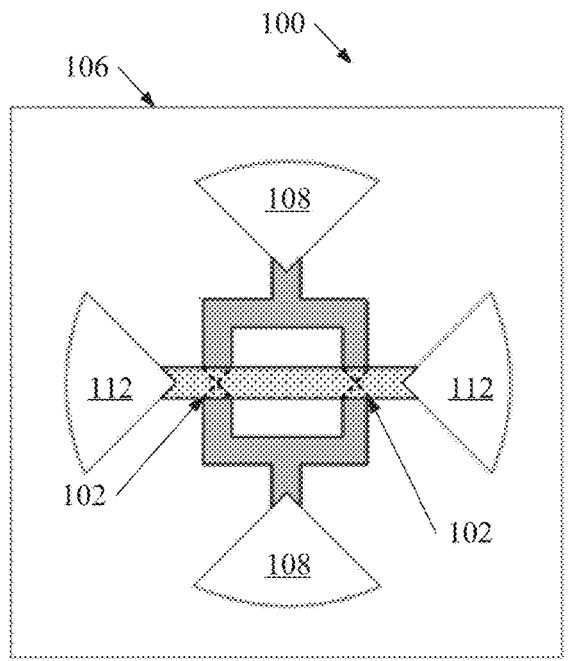
FIG. 7B illustrates a diagram of an example, non-limiting quadrupole pole implementation of a gradiometric superconducting quantum interface device during a fourth stage of manufacturing in accordance with one or more embodiments described herein.

FIG. 7B illustrates another diagram of an example, non-limiting gradiometric SQUID 100 during a fourth stage of manufacturing in accordance with one or more embodiments described herein. Repetitive description of like elements employed in other embodiments described herein is omitted for sake of brevity. For example, FIG. 7B can depict the fourth stage of manufacturing of the exemplary embodiment of FIG. 2. The features of the fourth stage of manufacturing described herein with regards to FIG. 7A can also be implemented in the fourth stage of manufacturing in any of the various embodiments of the one or more gradiometric SQUIDs 100, such as the fourth stage of manufacturing depicted in FIG. 7B.

Figure 7C:
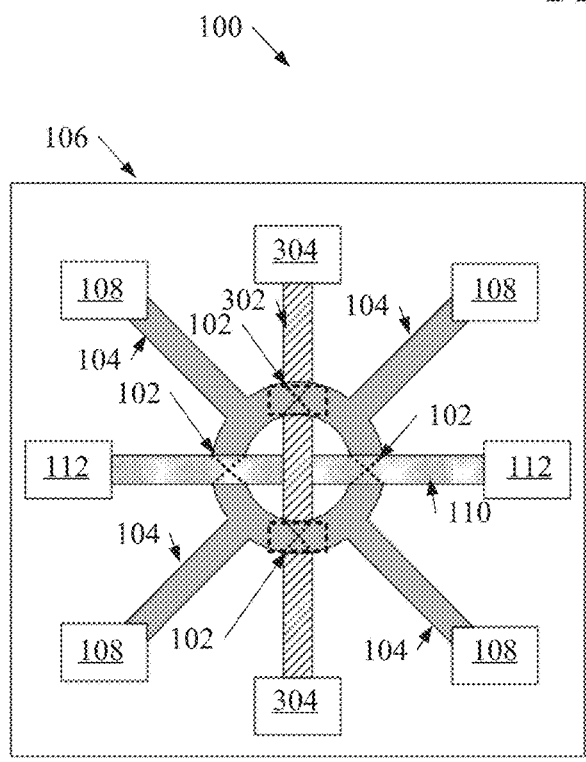
FIG. 7C illustrates a diagram of an example, non-limiting multipole implementation of a gradiometric superconducting quantum interface device during a fourth stage of manufacturing in accordance with one or more embodiments described herein.

FIG. 7C illustrates a further diagram of an example, non-limiting gradiometric SQUID 100 during a fourth stage of manufacturing in accordance with one or more embodiments described herein. Repetitive description of like elements employed in other embodiments described herein is omitted for sake of brevity. For example, FIG. 7C can depict the fourth stage of manufacturing of the exemplary embodiment of FIG. 3. The features of the fourth stage of manufacturing described herein with regards to FIG. 7A can also be implemented in the fourth stage of manufacturing in any of the various embodiments of the one or more gradiometric SQUIDs 100, such as the fourth stage of manufacturing depicted in FIG. 7C.

Additionally, as shown in FIG. 7C, during the fourth stage of manufacturing a third portion (e.g., defined by dashed lines in FIG. 7C) of the first pattern of the one or more first superconducting materials 104 can be deposited to complete the first pattern and/or form one or more Josephson junctions 102. Further, a second portion of the one or more second superconducting material 110 can be deposited to connect to the previously deposited first portion of the one or more second superconducting materials 110. The pattern portions deposited during the fourth stage of manufacturing can comprise the same materials. For example, the third portion of the one or more first superconducting materials 104 can have the same composition as the second portion of the one or more second superconducting materials 110; thereby facilitating a common deposition during the fourth stage of manufacturing. Thus, the fourth stage of manufacturing can complete one or more partially established patterns of superconducting material, such as the first pattern (e.g., comprising the one or more first superconducting materials 104) and/or the second pattern (e.g., comprising the one or more second superconducting materials 110). Moreover, the deposition during the fourth stage of manufacturing can create one or more Josephson junctions 102 and/or a plurality of loops of superconducting material.

Thus, the manufacturing stages described with regards to FIGS. 4A-7C can achieve multiple electrically continuous patterns of superconducting materials. For example, a first electrically continuous pattern of the one or more first superconducting materials 104 can be formed, a second electrically continuous pattern of the one or more second superconducting materials 110 can be formed, and/or a third electrically continuous pattern of the one or more third superconducting materials 302 can be formed. Additionally, the respective patterns can comprise non-uniform distributions of superconducting materials. For example, the first electrically continuous pattern of the one or more first superconducting materials 104 can comprise: a superconducting material of the one or more first superconducting materials 104 at a first portion of the first pattern, another superconducting material of the one or more superconducting materials 104 at a second portion of the first pattern, and/or still another superconducting material of the one or more superconducting materials 104 at a third portion of the first pattern. Moreover, one of ordinary skill in the art will recognize that further patterns of superconducting materials in addition to the three shown in FIGS. 4A-7C are also envisaged.

FIG. 8 illustrates a flow diagram of an example, non-limiting method 800 that can facilitate manufacturing one or more gradiometric SQUIDs 100 in accordance with one or more embodiments described herein. Repetitive description of like elements employed in other embodiments described herein is omitted for sake of brevity.

At 802, the method 800 can comprise depositing one or more first superconducting materials 104 onto one or more substrates 106 (e.g., as described herein with regards to the first stage and/or second stage of manufacturing exemplarily depicted in FIGS. 4A-5C). The depositing at 802 can be facilitate by one or more deposition techniques, which can include, but are not limited to: evaporation, thermal evaporation, electron beam evaporation, electron beam sputtering, ion-sputtering, plasma sputtering, pulsed-laser sputtering, MBE growth, epitaxial growth, a combination thereof, and/or the like. The depositing at 802 can form one or more first patterns of the one or more first superconducting materials 104. For example, the one or more first patterns can be ring formations as described in various embodiments herein. Additionally, the depositing at 802 can facilitate operably (electrically) coupling the one or more first superconducting materials 104 to one or more first capacitor pads 108. Further, the deposition can be facilitated by one or more lithography process, which can include, but are not limited to: electron beam lithography, optical lithography, deep-ultraviolet lithography, direct laser lithography, a combination thereof, and/or the like.

At 804, the method 800 can comprise forming one or more insulating barriers (e.g., one or more insulating materials 602) on a surface of the one or more first superconducting materials 104 that can be opposite to the one or more substrates 106 (e.g., as described herein with regards to the third stage of manufacturing exemplarily depicted in FIGS. 6A-6C). For example, the surface can be a top surface of the one or more first superconducting materials 104. In one or more embodiments, the forming at 804 can comprise oxidizing one or more first conducting materials previously deposited (e.g., at 802) onto the one or more substrates 106.

At 806, the method 800 can comprise depositing one or more second superconducting materials 110 over the one or more insulating barriers (e.g., one or more insulating materials 602) to form one or more Josephson junctions 102 (e.g., as described herein with regards to the fourth stage of manufacturing exemplarily depicted in FIGS. 7A-7C). The depositing at 806 can be facilitate by one or more deposition techniques, which can include, but are not limited to: evaporation, thermal evaporation, electron beam evaporation, electron beam sputtering, ion-sputtering, plasma sputtering, pulsed-laser sputtering, MBE growth, epitaxial growth, a combination thereof, and/or the like. The depositing at 806 can form one or more second patterns of the one or more second superconducting materials 110. Additionally, the deposition can be facilitated by one or more lithography process, which can include, but are not limited to: electron beam lithography, optical lithography, deep-ultraviolet lithography, direct laser lithography, a combination thereof, and/or the like. For example, the one or more second patterns can be path formations as described in various embodiments herein. Additionally, the depositing at 806 can facilitate operably (electrically) coupling the one or more second superconducting materials 110 to one or more second capacitor pads 112. In one or more embodiments, the depositing at 806 can further complete one or more partially completed patterns of superconducting material located on the one or more substrates 106.

FIG. 9 illustrates a flow diagram of an example, non-limiting method 900 that can facilitate manufacturing one or more gradiometric SQUIDs 100 in accordance with one or more embodiments described herein. Repetitive description of like elements employed in other embodiments described herein is omitted for sake of brevity.

At 902, the method 900 can comprise forming a first pattern (e.g., a ring formation) of superconducting material (e.g., one or more first superconducting materials 104) on one or more substrates 106 (e.g., as described herein with regards to the first stage and/or second stage of manufacturing exemplarily depicted in FIGS. 4A-5C). The forming at 902 can be facilitate by one or more deposition techniques, which can include, but are not limited to: evaporation, thermal evaporation, electron beam evaporation, electron beam sputtering, ion-sputtering, plasma sputtering, pulsed-laser sputtering, MBE growth, epitaxial growth, a combination thereof, and/or the like. Further, the deposition can be facilitated by one or more lithography process, which can include, but are not limited to: electron beam lithography, optical lithography, deep-ultraviolet lithography, direct laser lithography, a combination thereof, and/or the like. Additionally, the forming at 902 can facilitate operably (electrically) coupling the one or more superconducting materials (e.g., the one or more first superconducting materials 104) to one or more first capacitor pads 108. The first pattern formed at 902 can be a complete pattern of superconducting material or a partial pattern of superconducting material.

At 904, the method 900 can comprise forming one or more insulating barriers (e.g., one or more insulating materials 602) adjacent to the first pattern of the one or more superconducting materials (e.g., one or more first superconducting materials 104) such that the first pattern of superconducting material can separate the one or more insulating barriers (e.g., one or more insulating material 602) from the one or more substrates 106 (e.g., as described herein with regards to the third stage of manufacturing exemplarily depicted in FIGS. 6A-6C). For example, the one or more insulating barriers can be formed on a top surface of the one or more superconducting materials. In one or more embodiments, the forming at 904 can comprise oxidizing one or more portions of the one or more superconducting materials.

At 906, the method 900 can comprise forming one or more second patterns of superconducting material across the one or more insulating barriers to form one or more Josephson junctions 102 (e.g., as described herein with regards to the fourth stage of manufacturing exemplarily depicted in FIGS. 7A-7C). The forming at 906 can be facilitate by one or more deposition techniques, which can include, but are not limited to: evaporation, thermal evaporation, electron beam evaporation, electron beam sputtering, ion-sputtering, plasma sputtering, pulsed-laser sputtering, MBE growth, epitaxial growth, a combination thereof, and/or the like. Further, the deposition can be facilitated by one or more lithography process, which can include, but are not limited to: electron beam lithography, optical lithography, deep-ultraviolet lithography, direct laser lithography, a combination thereof, and/or the like. Additionally, the forming at 906 can facilitate operably (electrically) coupling the one or more superconducting materials (e.g., one or more second superconducting materials 110) to one or more second capacitor pads 112. In one or more embodiments, the forming at 906 can further complete one or more partially completed patterns of superconducting material located on the one or more substrates 106.

Figure 10:
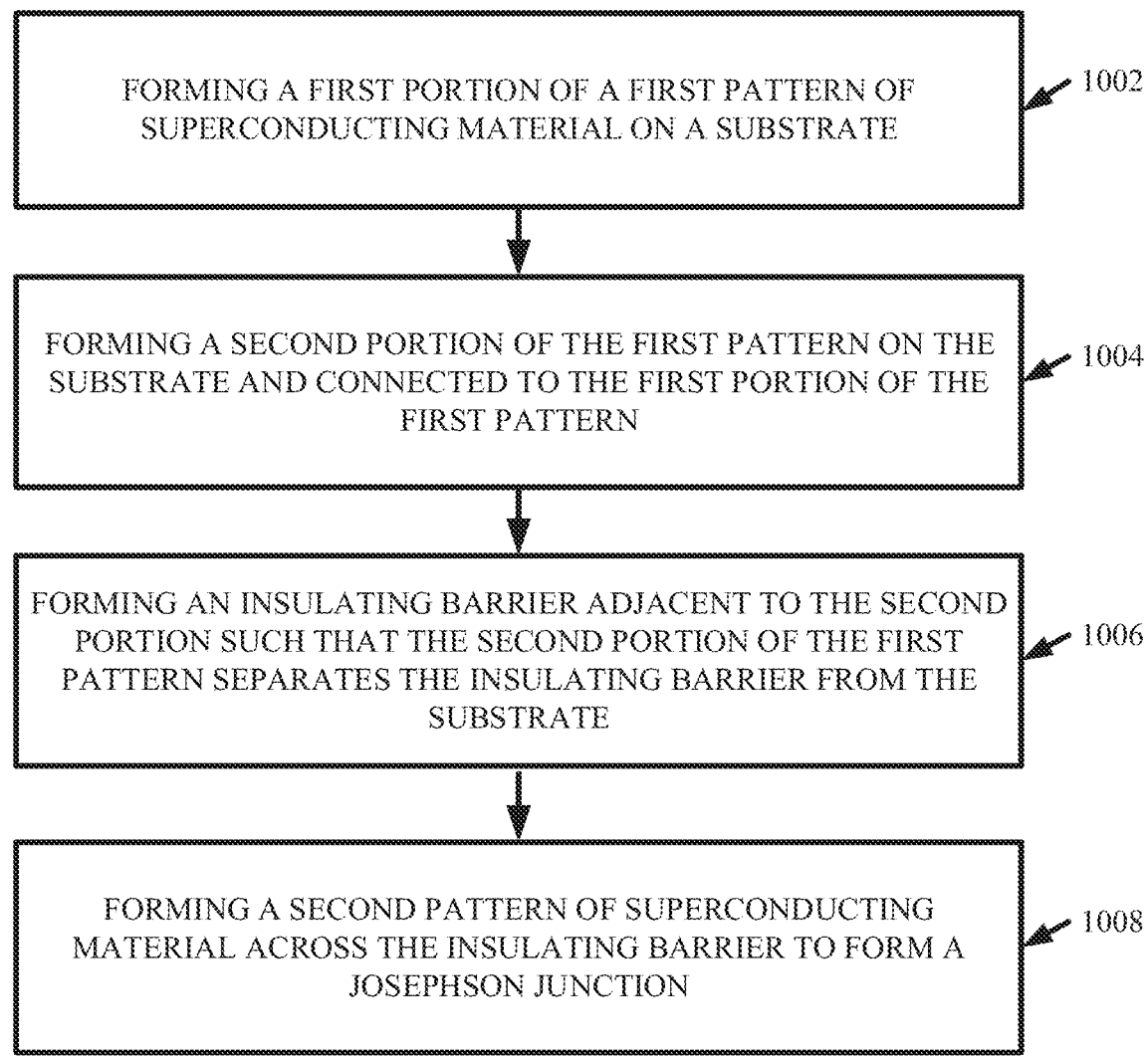
FIG. 10 illustrates a flow diagram of an example, non-limiting method that can facilitate manufacturing of one or more gradiometric superconducting quantum interface devices in accordance with one or more embodiments described herein.

FIG. 10 illustrates a flow diagram of an example, non-limiting method 1000 that can facilitate manufacturing one or more gradiometric SQUIDs 100 in accordance with one or more embodiments described herein. Repetitive description of like elements employed in other embodiments described herein is omitted for sake of brevity.

At 1002, the method 1000 can comprise forming a first portion of a first pattern (e.g., a ring formation) of superconducting material (e.g., one or more first superconducting materials 104) on one or more substrates 106 (e.g., as described herein with regards to the first stage exemplarily depicted in FIGS. 4A-4C). The forming at 1002 can be facilitate by one or more deposition techniques, which can include, but are not limited to: evaporation, thermal evaporation, electron beam evaporation, electron beam sputtering, ion-sputtering, plasma sputtering, pulsed-laser sputtering, MBE growth, epitaxial growth, a combination thereof, and/or the like. Further, the deposition can be facilitated by one or more lithography process, which can include, but are not limited to: electron beam lithography, optical lithography, deep-ultraviolet lithography, direct laser lithography, a combination thereof, and/or the like. Additionally, the forming at 1002 can facilitate operably (electrically) coupling the one or more superconducting materials (e.g., the one or more first superconducting materials 104) to one or more first capacitor pads 108.

At 1004, the method 1000 can comprise forming a second portion of the first pattern on the one or more substrates 106 and connected to the first portion of the first pattern (e.g., as described herein with regards to the first stage exemplarily depicted in FIGS. 5A-5C). For example, the superconducting material comprising the first portion of the first pattern can have a different composition than the superconducting material comprising the second portion of the first pattern. The forming at 1004 can be facilitate by one or more deposition techniques, which can include, but are not limited to: evaporation, thermal evaporation, electron beam evaporation, electron beam sputtering, ion-sputtering, plasma sputtering, pulsed-laser sputtering, MBE growth, epitaxial growth, a combination thereof, and/or the like. Additionally, the deposition can be facilitated by one or more lithography process, which can include, but are not limited to: electron beam lithography, optical lithography, deep-ultraviolet lithography, direct laser lithography, a combination thereof, and/or the like.

At 1006, the method 1000 can comprise forming one or more insulating barriers (e.g., one or more insulating materials 602) adjacent to the second portion such that the first pattern of superconducting material can separate the one or more insulating barriers (e.g., one or more insulating material 602) from the one or more substrates 106 (e.g., as described herein with regards to the third stage of manufacturing exemplarily depicted in FIGS. 6A-6C). For example, the one or more insulating barriers can be formed on a top surface of the one or more superconducting materials comprising the second portion of the first pattern. In one or more embodiments, the forming at 1006 can comprise oxidizing the second portion of the first pattern of one or more superconducting materials.

At 1008, the method 1000 can comprise forming one or more second patterns of superconducting material across the one or more insulating barriers to form one or more Josephson junctions 102 (e.g., as described herein with regards to the fourth stage of manufacturing exemplarily depicted in FIGS. 7A-7C). The forming at 1006 can be facilitate by one or more deposition techniques, which can include, but are not limited to: evaporation, thermal evaporation, electron beam evaporation, electron beam sputtering, ion-sputtering, plasma sputtering, pulsed-laser sputtering, MBE growth, epitaxial growth, a combination thereof, and/or the like. Further, the deposition can be facilitated by one or more lithography process, which can include, but are not limited to: electron beam lithography, optical lithography, deep-ultraviolet lithography, direct laser lithography, a combination thereof, and/or the like. Additionally, the forming at 1006 can facilitate operably (electrically) coupling the one or more superconducting materials (e.g., one or more second superconducting materials 110) to one or more second capacitor pads 112. In one or more embodiments, the forming at 1008 can further complete one or more partially completed patterns of superconducting material located on the one or more substrates 106.

One of ordinary skill in the art will recognize that the various features and/or embodiments of the stages of manufacturing described herein with regards to FIG. 4A-7C can facilitate the various features and/or embodiments of the methods described herein (e.g., method 800, method 900, and/or method 1000). Further, the various methods described herein can facilitate manufacturing of any and/or all of the numerous embodiments described herein.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

It is, of course, not possible to describe every conceivable combination of components, products and/or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus, comprising:
a first superconducting material located on a substrate and formed in a first pattern having a hollow interior region;
a second superconducting material formed in a second pattern distinct from the first pattern, the first pattern and the second pattern overlapping at a first defined position of the first pattern and being non-overlapping at a second defined position of the first pattern; and
a Josephson junction located at the first defined position at which the first pattern and the second pattern overlap, wherein the Josephson Junction comprises an insulating barrier that connects the first superconducting material and the second superconducting material, wherein the first pattern is a ring shape, wherein the second pattern extends from a first side of the ring shape to a second side of the ring shape, and wherein the Josephson junction is located at the defined position where the second pattern overlaps the first pattern.

2. The apparatus of claim 1, wherein the first superconducting material is operably coupled to a first capacitor pad, and wherein the second superconducting material extends across the first pattern to operably couple to a second capacitor pad.

3. The apparatus of claim 1, wherein the apparatus is a gradiometric superconducting quantum interference device.

4. The apparatus of claim 1, wherein the Josephson junction is a superconductor-insulator-superconductor Josephson junction.

5. The apparatus of claim 1, wherein the Josephson junction comprises a first superconductor metal comprised within the first superconducting material and a second superconductor metal comprised within the second superconducting material.

6. The apparatus of claim 5, wherein the first superconductor metal is different from the second superconductor metal.

7. The apparatus of claim 5, wherein the first superconductor metal is selected from a first group consisting of a type-1 superconducting material and a type-2 superconducting material, wherein the second superconductor metal is selected from a second group consisting of the type-1 superconducting material and the type-2 superconducting material, and wherein the insulating barrier is an electrically insulating dielectric material at low temperature.

8. The apparatus of claim 1, wherein the first superconducting material is aluminum, wherein the second superconducting material is aluminum, and wherein the insulating barrier is aluminum oxide.

9. The apparatus of claim 1, further comprising:
a third superconducting material that extends across the first pattern of the first superconducting material; and
a second Josephson junction comprising a second insulating barrier that connects the third superconducting material and the first superconducting material.

10. A method, comprising:
depositing a first superconducting material onto a substrate, wherein the first superconducting material is formed in a first pattern having a hollow interior region;
forming an insulating barrier on a surface of the first superconducting material that is opposite to the substrate; and
depositing a second superconducting material formed in a second pattern distinct from the first pattern over the insulating barrier to form a Josephson junction, wherein the Josephson Junction is formed at a defined position at which the first pattern, the second pattern and the insulating barrier overlap, wherein the first pattern is formed in a ring shape, wherein the second pattern extends from a first side of the ring shape to a second side of the ring shape, and wherein the Josephson junction is located at the defined position where the second pattern overlaps the first pattern.

11. The method of claim 10, wherein the method forms a gradiometric superconducting quantum interference device, and wherein the Josephson junction is a superconductor-insulator-superconductor Josephson junction that connects the first superconducting material and the second superconducting material.

12. The method of claim 10, wherein the forming the insulating barrier comprises oxidizing the first superconducting material.

13. The method of claim 10, wherein the depositing the first superconducting material comprises evaporating the first superconducting material onto the substrate, and wherein the depositing the second superconducting material comprises evaporating the second superconducting material over the insulating barrier.

14. The method of claim 10, wherein the first superconducting material is selected from a first group consisting of a type-1 superconducting material and a type-2 superconducting material, wherein the second superconducting material is selected from a second group consisting of a type-1 superconducting material and a type-2 superconducting material, and wherein the insulating barrier is an electrically insulating dielectric material at low temperature.

15. A method, comprising:
forming a first pattern of a first superconducting material on a substrate;
forming an insulating barrier adjacent to the first superconducting material such that the first superconducting material separates the insulating barrier from the substrate; and
forming a second pattern of a second superconducting material across the insulating barrier to form a Josephson junction, wherein a first shape of the first pattern is distinct from a second shape of the second pattern, wherein the first pattern is formed in a ring shape, wherein the second pattern extends from a first side of the ring shape to a second side of the ring shape, and wherein the Josephson junction is located at the defined position where the second pattern overlaps the first pattern.

16. The method of claim 15, wherein the method forms a gradiometric superconducting quantum interference device, and wherein the Josephson junction is a superconductor-insulator-superconductor Josephson junction that connects the first pattern of superconducting material and the second pattern of superconducting material.

17. The method of claim 15, wherein the forming the insulating barrier comprises oxidizing the first pattern of superconducting material.

18. The method of claim 15, wherein the forming the first pattern of superconducting material comprises evaporating a first portion of the superconducting material onto the substrate in the first pattern, and wherein the forming the second pattern of second superconducting material comprises evaporating a second portion of the superconducting material over the insulating barrier in the second pattern.

19. The method of claim 15, wherein the first superconducting material is aluminum, wherein the second superconducting material is aluminum, and wherein the insulating barrier is aluminum oxide.

\* \* \* \* \*